United States Patent
Takayama

(10) Patent No.: US 6,671,297 B2
(45) Date of Patent: Dec. 30, 2003

(54) WAVELENGTH CONVERSION DEVICE

(75) Inventor: Toru Takayama, Nara (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/131,664

(22) Filed: Apr. 24, 2002

(65) Prior Publication Data
US 2002/0159486 A1 Oct. 31, 2002

(30) Foreign Application Priority Data

Apr. 26, 2001 (JP) ....................... 2001-128900
Apr. 26, 2001 (JP) ....................... 2001-128901
Jul. 6, 2001 (JP) ....................... 2001-205863

(51) Int. Cl.[7] ................................. H01S 3/10
(52) U.S. Cl. .................. 372/22; 372/21; 372/23; 372/43; 385/14; 385/37
(58) Field of Search ................ 372/22, 43, 21, 372/23; 385/14, 37, 129, 130, 88, 92, 93, 94

(56) References Cited

U.S. PATENT DOCUMENTS 5,835,650 A * 11/1998 Kitaoka et al. ............. 385/49
6,501,868 B1 * 12/2002 Kitaoka et al. ............. 385/14

FOREIGN PATENT DOCUMENTS

JP 2000-284135 A 10/2000

* cited by examiner

Primary Examiner—Paul Ip
Assistant Examiner—Delma R. Flores-Ruiz
(74) Attorney, Agent, or Firm—Merchant & Gould P.C.

(57) ABSTRACT

A wavelength conversion device that converts a wavelength by second harmonic-wave generation and generates a laser beam, includes: a substrate having a plurality of electrodes; a semiconductor laser device mounted on the substrate and electrically connected to the plurality of electrodes; and a nonlinear optical element having an optical waveguide for guiding a laser beam emitted from the semiconductor laser device and for converting a wavelength of the laser beam. Here, the nonlinear optical element is mounted on the substrate so that the optical waveguide in the nonlinear optical element is located away from the center line of the substrate. Thereby, a small wavelength conversion device provided with a semiconductor laser device and a nonlinear optical element, which are mounted on the substrate in an integrated manner, can be obtained, and therefore an optical pickup unit in the optical disk employing this wavelength conversion device can be miniaturized.

32 Claims, 8 Drawing Sheets

WAVELENGTH CONVERSION DEVICE

BACKGROUND OF THE INVENTION

1. Field of the Invention

The present invention relates to a wavelength conversion device composed of a semiconductor laser device and a nonlinear optical element having a planar optical waveguide, which are mounted on a substrate in an integrated manner.

2. Related Background Art

In order to realize a high-density optical disk and a high-definition display, small short-wavelength light sources generating a laser beam in a blue range through violet range are desired. Techniques for obtaining a laser beam in this wavelength range include a second harmonic-wave generation method (hereinafter referred to as "SHG") that employs a wavelength conversion device using a planar optical waveguide according to a quasi-phase-matching method, by which a wavelength of a semiconductor laser can be converted from 850 nm into 425 nm.

To miniaturize a short-wavelength light source according to this method, it is effective to mount a wavelength conversion device and a semiconductor laser device on a substrate in an integrated manner.

FIG. 15 shows one example of these small short-wavelength light sources, which is a wavelength conversion device disclosed in JP 2000-284135 A.

A semiconductor laser device 306 and a planar optical waveguide device 305 are mounted on a silicon substrate 300 in an integrated manner. The planar optical waveguide device 305 functions as a wavelength conversion device structured by forming a proton exchange planar optical waveguide 304 and a diffraction grating (not illustrated) with periodic domain inverted regions formed therein on an Mg doped $LiNbO_3$ substrate 302. In addition, on the silicon substrate 300, electrodes 307 electrically connected to the semiconductor laser device 306 are formed, and alignment keys 301 are formed at positions 10 $\mu$m away from the planar optical waveguide 304. On each side of the planar optical waveguide 304, alignment keys 303 are formed using a film made of the same material (e.g., Ta) and having the same thickness as those of the alignment keys 301. Further, alignment keys 308 are formed on the semiconductor laser device 306 as well.

Here, the semiconductor laser device 306 is a Distributed Bragg Reflector (hereinafter, referred to as "DBR") type semiconductor laser device. As shown in FIG. 15, the electrodes 307 are connected to each of a gain region and a wavelength control region, i.e., a DBR region (not illustrated) of the semiconductor laser device 306.

The semiconductor laser device 306 and the planar optical waveguide device 305 are mounted onto the silicon substrate 300 in such a manner that a laser beam emitted from the semiconductor laser device 306 is guided through the optical waveguide 304 in the planar optical waveguide device 305, and the alignment keys 308, 303, and 301 are arranged at their predetermined positions. In this wavelength conversion device, a center line M1–M2 of the silicon substrate 300, a center line M5–M6 of the semiconductor laser device 306, and a center line M3–M4 of the planar optical waveguide device 305 approximately coincide with one another.

In the future, to miniaturize an optical information processing system employing an optical disk and a display still more than present ones, an optical pick up unit included in an optical disk or the like needs to be made small. To this end, it becomes effective to make a wavelength conversion device smaller.

Meanwhile, when electrically driving such a wavelength conversion device, an oscillation wavelength of a laser beam emitted from the semiconductor laser device 306 needs to be controlled so as to maximize a conversion efficiency of the laser beam by the SHG.

In the wavelength conversion device shown in FIG. 15, by controlling a current applied to the electrode connected to the DBR region, among the electrodes 307, a refractive index of the DBR region is varied so as to change a Bragg wavelength, whereby the oscillation wavelength is controlled. In this wavelength conversion device, however, a phase of the emitted laser beam cannot be controlled, because the semiconductor laser device 306 consists of only two regions, i.e., the gain region and the DBR region. Due to such a constraint, if a Bragg wavelength in the DBR region is varied by the passage of the electric current, then a so-called mode hoping would occur, where the oscillation wavelength changes discontinuously. In this case, it becomes difficult to control the oscillation wavelength, which might interfere with the operation of the device significantly.

SUMMARY OF THE INVENTION

Therefore, with the foregoing in mind, it is an object of the present invention to provide a small short-wavelength conversion device composed of a semiconductor laser device and an optical waveguide device, which are mounted on a substrate in an integrated manner.

To fulfill the above-stated object, a wavelength conversion device according to an embodiment of the present invention, which converts a wavelength by second harmonic-wave generation and generates a laser beam, includes: a substrate having a plurality of electrodes; a semiconductor laser device mounted on the substrate and electrically connected to the plurality of electrodes; and a nonlinear optical element having an optical waveguide for guiding a laser beam emitted from the semiconductor laser device and for converting a wavelength of the laser beam. Here, the nonlinear optical element is mounted on the substrate in such a manner that the optical waveguide in the nonlinear optical element is located away from the center line of the substrate.

To fulfill the above-stated object, a wavelength conversion device according to another embodiment of the present invention, which converts a wavelength by second harmonic-wave generation and generates a laser beam, includes: a substrate having a plurality of electrodes; a semiconductor laser device electrically connected to the plurality of electrodes; and a nonlinear optical element having an optical waveguide for guiding a laser beam emitted from the semiconductor laser device and for converting a wavelength of the laser beam. Here, the semiconductor laser device, the optical waveguide of the nonlinear optical element, and the plurality of electrodes are on approximately one line on the substrate.

It is another object of the present invention to provide a wavelength conversion device by which an oscillation wavelength of a laser beam emitted from a semiconductor laser device can be controlled with stability.

To fulfill the above-stated object, a wavelength conversion device according to an embodiment of the present invention, which converts a wavelength by second harmonic-wave generation and generates a laser beam, includes: a substrate having a plurality of electrodes; a semiconductor laser device mounted on the substrate and including three regions of a gain region, a phase control region, and a wavelength control region; and a nonlinear optical element mounted on the substrate and for converting a wavelength of a laser beam emitted from the semiconductor laser device. Here, the plurality of electrodes include a first electrode group formed corresponding to the three regions and a second electrode group for carrying out wire-bonding with an external power source, the three regions of the semiconductor laser device are connected electrically to the respective electrodes in the first electrode group, and the first electrode group further is connected to the respective electrodes in the second electrode group via wires, and a wire among the wires, which is connected between the phase control region and the wavelength control region of the semiconductor laser device, has a portion functioning as a resistor.

DETAILED DESCRIPTION OF THE INVENTION

The following describes embodiments of the present invention, with reference to the drawings.

[Embodiment 1]

Figure 1:
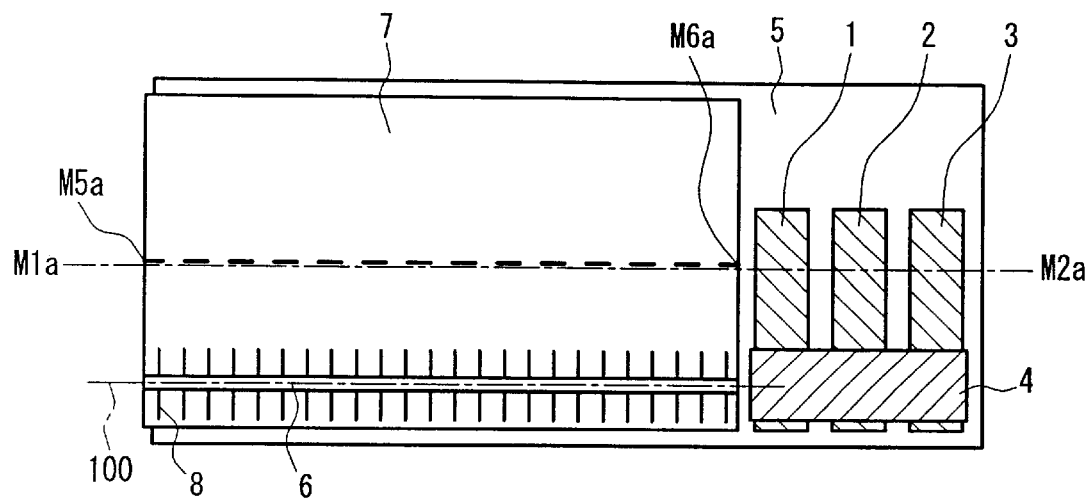
FIG. 1 is a plan view of a wavelength conversion device according to Embodiment 1.

FIG. 1 is a plan view of a wavelength conversion device according to this embodiment. On a silicon substrate (3 mm in width, 15 mm in length), electrodes 1, 2, and 3 are formed by patterning, and a DBR laser element 4 (0.3 mm in width, 1.2 mm in length) and a nonlinear optical element 7 (2.8 mm in width, 10 mm in length) are mounted in an integrated manner. Numeral 6 denotes an optical waveguide, and 8 denotes a diffraction grating formed in the optical waveguide 6. Line 100 is a center line of the optical waveguide 6. Line M1a–M2a is a center line of the width direction of the silicon substrate 5, and line M5a–M6a is a center line of the width direction of the nonlinear optical element 7. Hereinafter, in the wavelength conversion devices according to the present invention, the direction perpendicular to the optical waveguide is referred to as the width direction, while the direction parallel to the optical waveguide is referred to as the longitudinal direction.

The DBR laser element 4 is made up of three regions including a gain region that adjusts an output power of a laser beam emitted therefrom, a phase control region that changes a phase of the laser beam, and a DBR region that feeds back a laser beam with an oscillation wavelength into a cavity. Note here that these regions referred to in this embodiment or later in this specification have the functions as stated above.

With respect to these three regions, electrodes that are electrically isolated from one another are formed (not illustrated). The DBR laser element 4 is mounted on the silicon substrate 5 in a junction down manner where a surface with the p-n junction faces to the side of the silicon substrate 5, and electrodes corresponding to the gain region, the phase control region, and the DBR region are bonded to the electrodes 1, 2, and 3 on the silicon substrate 5, respectively. Also, wire-bonding regions are formed in each of the electrodes for carrying out wiring with an external power source so as to electrically drive the gain region, the phase control region, and the DBR region.

In this way, the gain region, the phase control region, and the DBR region of the DBR laser element 4 are connected electrically to the electrodes 1, 2, and 3, respectively. In this state, by feeding an electrical signal to each of the electrodes, an oscillation wavelength of the laser beam emitted from the DBR laser element 4 can be varied. The oscillation wavelength of the laser beam emitted from the DBR laser element 4 is set at 820 nm, and the beam is oscillated in the single longitudinal mode.

The nonlinear optical element 7 is made of $LiNbO_3$, and the optical waveguide 6 having the diffraction grating 8 is formed therein. The nonlinear optical element 7 is fixed onto the silicon substrate 5 at a predetermined position with an adhesive such as a UV curing agent.

The diffraction grating 8 is formed by inverting a polarization of $LiNbO_3$ crystals with the application of an external electric field. The optical waveguide 6 is positioned within 3 μm of the DBR laser element 4 so as to introduce the laser beam emitted from the DBR laser element 4 securely.

When guiding the laser beam through the optical waveguide 6, a second harmonic-wave generated beam (hereinafter, referred to as "SHG beam") with a wavelength of 410 nm generated in the nonlinear optical element 7 due to a diffraction by the diffraction grating 8 and the laser beam with an oscillation wavelength of 820 nm are quasi-phase matched. Thereby, an SHG beam having a high output power can be obtained. In addition, by controlling the oscillation wavelength of the laser beam emitted from the DBR laser element 4, a conversion efficiency into the SHG beam can be improved.

In this embodiment, as shown in FIG. 1, the nonlinear optical element 7 is mounted on the silicon substrate 5 in such a manner that the center line 100 of its optical waveguide 6 is 1.0 mm away from the center line M1a–M2a of the silicon substrate 5. In this way, in this embodiment, the optical waveguide 6 does not necessarily need to be formed on the center line M5a–M6a of the nonlinear optical element 7.

In addition, the nonlinear optical element 7 is mounted so that the center line M1a–M2a of the silicon substrate 5 coincides with the center line M5a–M6a of the nonlinear optical element 7 in FIG. 1. However, these center lines do not necessarily coincide with each other.

Furthermore, the end of the optical waveguide 6 at the side of the nonlinear optical element 7 where the SHG beam is emitted is located at least 5 $\mu$m beyond the edge of the silicon substrate 5. This construction prevents the SHG beam from being reflected from the silicon substrate 5 and scattered, and therefore a favorable image can be obtained in the far field for the SHG beam emitted from the nonlinear optical element 7.

According to this embodiment, since the nonlinear optical element 7 is mounted on the substrate in such a manner that its optical waveguide 6 is located away from the center line M1a–M2a of the silicon substrate 5, the width of the wavelength conversion device can be narrowed to 5 $\mu$mm or less, and therefore a small wavelength conversion device having approximately the same size as the nonlinear optical element 7 can be realized.

[Embodiment 2]

Figure 2:
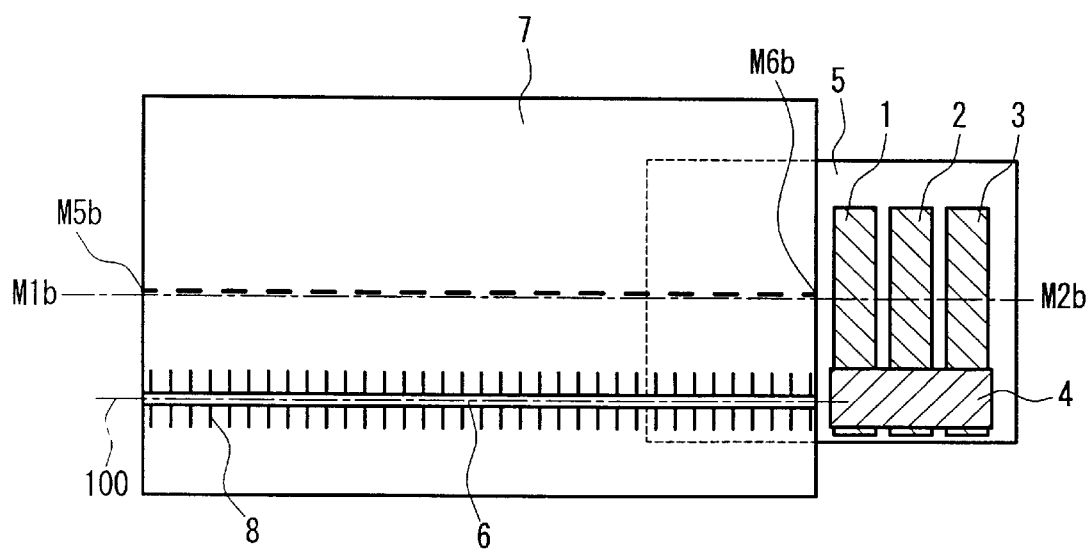
FIG. 2 is a plan view of a wavelength conversion device according to Embodiment 2.

FIG. 2 is a plan view of a wavelength conversion device according to this embodiment. On a silicon substrate 5 (2 mm in width, 6 mm in length), electrodes 1, 2, and 3 are formed by patterning, and a DBR laser element 4 (0.3 mm in width, 1.2 mm in length) and a nonlinear optical element 7 (2.8 mm in width, 10 mm in length) are mounted in an integrated manner. Numeral 6 denotes an optical waveguide, and 8 denotes a diffraction grating formed in the optical waveguide 6. Line 100 is a center line of the optical waveguide 6. Line M1b–M2b is a center line of the width direction of the silicon substrate 5, and line M5b–M6b is a center line of the width direction of the nonlinear optical element 7. In this way, the construction of the wavelength conversion device in this embodiment is similar to that of the wavelength conversion device according to Embodiment 1, except that the silicon substrate 5 is miniaturized so that a length of a region where the DBR laser element 4 is mounted on the silicon substrate 5 is 3 mm along the longitudinal direction of the silicon substrate 5, and the nonlinear optical element 7 is mounted on the substrate so that the center line 100 of its optical wavelength 6 is 0.7 mm away from the center line of the silicon substrate 5. That is, in this embodiment also, the nonlinear optical element 7 is positioned within 3 $\mu$m of the DBR laser element 4 so as to introduce the laser beam emitted from the DBR laser element 4 securely, and the end of the optical waveguide 6 at the side where the SHG beam is emitted is located at least 5 $\mu$m beyond the edge of the silicon substrate 5. Therefore, their explanations will be omitted.

According to this embodiment, the same effects as in Embodiment 1 can be obtained. In addition, by reducing the length of the silicon substrate 5, the region where the nonlinear optical element 7 is mounted on the silicon substrate 5 is narrowed. Therefore, distortion generated due to the contact between the nonlinear optical element 7 and the silicon substrate 5 can be reduced, and a conversion efficiency from the laser beam emitted from the DBR laser element 4 into the SHG beam can be improved.

[Embodiment 3]

Figure 3:
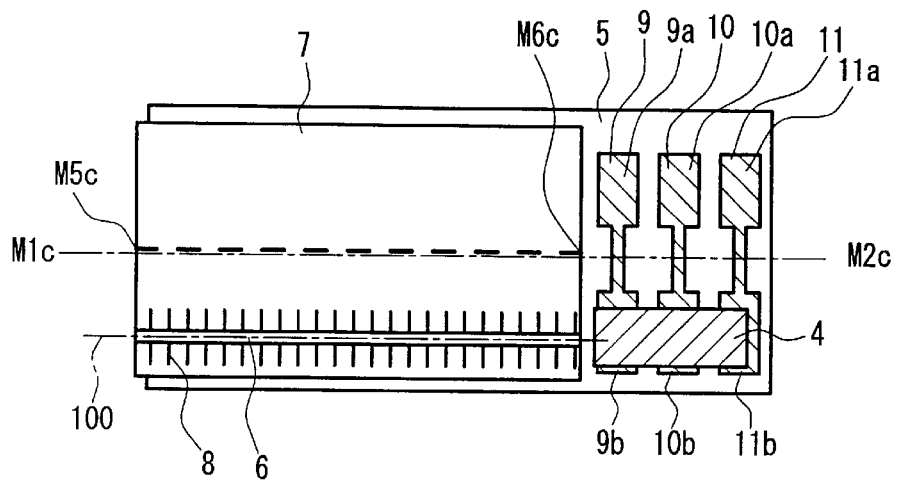
FIG. 3 is a plan view of a wavelength conversion device according to Embodiment 3.

FIG. 3 is a plan view of a wavelength conversion device according to this embodiment. On a silicon substrate 5 (3.0 mm in width, 12 mm in length), electrodes 9, 10, and 11 are formed by patterning, and a DBR laser element 4 (0.3 mm in width, 1.2 mm in length) and a nonlinear optical element 7 (2.8 mm in width, 10 mm in length) are mounted in an integrated manner. Numeral 6 denotes an optical waveguide, and 8 denotes a diffraction grating formed in the optical waveguide 6. Line 100 is a center line of the optical waveguide 6. Line M1c–M2c is a center line of the width direction of the silicon substrate 5, and line M5c–M6c is a center line of the width direction of the nonlinear optical element 7.

The DBR laser element 4 is made up of three regions including a gain region, a phase control region, and a DBR region.

With respect to these three regions, electrodes that are electrically isolated from one another are formed (not illustrated). The DBR laser element 4 is mounted on the silicon substrate 5 in a junction down manner where a surface with the p-n junction faces to the side of the silicon substrate 5, and electrodes corresponding to the gain region, the phase control region, and the DBR region are bonded to regions 9b, 10b, and 11b of the electrodes 9, 10, and 11, respectively.

Also, wire-bonding regions 9a, 10a, and 11a are formed in each of the electrodes 9, 10, and 11 for carrying out wiring with an external power source so as to electrically drive the gain region, the phase control region, and the DBR region of the DBR laser element 4. Here, widths of portions formed between these wire-bonding regions and regions 9b, 10b, and 11b (hereinafter, refered to as "connection regions", which are connected to the respective electrodes formed in the three regions in the DBR laser element 4) are narrower than those of the wire-bonding regions and the connection regions. In this way, by partially narrowing the width of each of the electrodes formed on the silicon substrate 5, the parasitic capacitance of these electrodes can be reduced.

As stated above, the construction of the wavelength conversion device according to this embodiment is similar to that of the wavelength conversion device according to Embodiment 1, except that the width of each electrode formed on the silicon substrate 5 is narrowed in part, and the nonlinear optical element 7 is mounted on the substrate so that the center line 100 of its optical wavelength 6 is 1.0 mm away from the center line of the silicon substrate 5. That is, in this embodiment also, the nonlinear optical element 7 is positioned within 3 $\mu$m of the DBR laser element 4, and the end of the optical waveguide 6 at the side where the SHG beam is emitted is located at least 5 $\mu$m beyond the edge of the silicon substrate 5. Therefore, their explanations will be omitted.

According to this embodiment, the same effects as in Embodiment 1 can be obtained. In addition, by partially narrowing the width of each electrode formed on the silicon substrate 5, the parasitic capacitance of these electrodes can be reduced, and therefore an electrical modulation frequency of the DBR laser element 4 can be increased.

[Embodiment 4]

Figure 4:
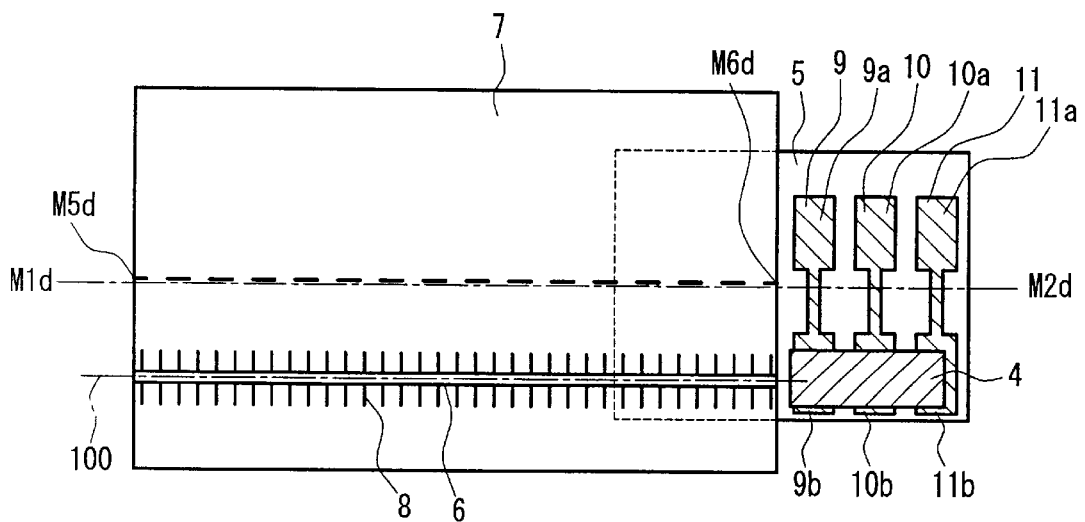
FIG. 4 is a plan view of a wavelength conversion device according to Embodiment 4.

FIG. 4 is a plan view of a wavelength conversion device according to this embodiment. On a silicon substrate 5 (2.0 mm in width, 6.0 mm in length), electrodes 9, 10, and 11 are formed by patterning, and a DBR laser element 4 (0.3 mm in width, 1.2 mm in length) and a nonlinear optical element 7 (2.8 mm in width, 10 mm in length) are mounted in an integrated manner. Numeral 6 denotes an optical waveguide, and 8 denotes a diffraction grating formed in the optical waveguide 6. Line 100 is a center line of the optical waveguide 6. Line M1d–M2d is a center line of the width direction of the silicon substrate 5, and line M5d–M6d is a center line of the width direction of the nonlinear optical element 7.

The DBR laser element 4 is made up of three regions including a gain region, a phase control region, and a DBR region.

With respect to these three regions, electrodes that are electrically isolated from one another are formed (not illustrated). The DBR laser element 4 is mounted on the silicon substrate 5 in a junction down manner where a surface with the p-n junction faces to the side of the silicon substrate 5, and electrodes corresponding to the gain region, the phase control region, and the DBR region are bonded to regions 9b, 10b, and 11b of the electrodes 9, 10, and 11, respectively.

Also, wire-bonding regions 9a, 10a, and 11a are formed in each of the electrodes 9, 10, and 11 for carrying out wiring with an external power source so as to electrically drive the gain region, the phase control region, and the DBR region of the DBR laser element 4. Here, widths of portions formed between these wire-bonding regions and regions 9b, 10b, and 11b (hereinafter, referred to as "connection regions", which are connected to the respective electrodes formed in the three regions n the DBR laser element 4) are narrower than those of the wire-bonding regions and the connection regions. In this way, by partially narrowing the width of each of the electrodes formed on the silicon substrate 5, the parasitic capacitance of these electrodes can be reduced. As stated above, the construction of the wavelength conversion device according to this embodiment is similar to that of the wavelength conversion device according to Embodiment 1, except that the silicon substrate 5 is miniaturized so that a length of a region where the DBR laser element 4 is mounted on the silicon substrate 5 is 3 mm along the longitudinal direction of the silicon substrate 5, the nonlinear optical element 7 is mounted on the substrate so that the center line 100 of its optical wavelength 6 is 0.7 mm away from the center line of the silicon substrate 5, and the width of each electrode formed on the silicon substrate 5 is narrowed in part. That is, in this embodiment also, the nonlinear optical element 7 is positioned within 3 $\mu$m of the DBR laser element 4, and the end of the optical waveguide 6 at the side where the SHG beam is emitted is located at least 5 $\mu$m beyond the edge of the silicon substrate 5. Therefore, their explanations will be omitted.

According to this embodiment, the same effects as in Embodiment 1 can be obtained. In addition, by reducing the length of the silicon substrate 5, the region where the optical element 7 is mounted on the silicon substrate 5 is narrowed. Therefore, distortion generated in the optical waveguide 6 due to the contact between the nonlinear optical element 7 and the silicon substrate 5 can be reduced, and a conversion efficiency from the laser beam emitted from the DBR laser element 4 into the SHG beam can be improved. Furthermore, by partially narrowing the width of each electrode formed on the silicon substrate 5, the parasitic capacitance of these electrodes can be reduced, and therefore an electrical modulation frequency of the DBR laser element 4 can be increased.

[Embodiment 5]

Figure 5:
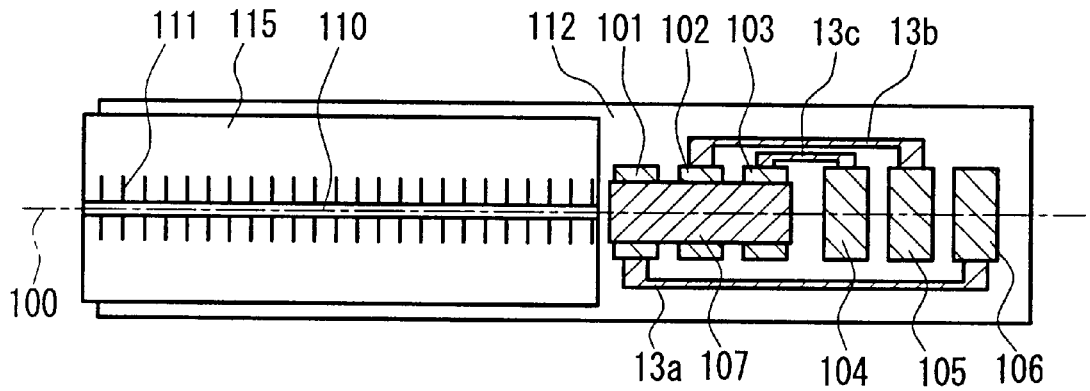
FIG. 5 is a plan view of a wavelength conversion device according to Embodiment 5.

FIG. 5 is a plan view of a wavelength conversion device according to this embodiment. On a silicon substrate 112 (3 mm in width, 15 mm in length), electrodes 101, 102, 103, 104, 105, and 106 are formed by patterning, and a DBR laser element 107 (0.3 mm in width, 1.2 mm in length) and a nonlinear optical element 115 (2.8 mm in width, 10 mm in length) are mounted in an integrated manner. Numeral 110 denotes an optical waveguide, and 111 denotes a diffraction grating formed in the optical waveguide 110. Line 100 is a center line of the optical waveguide 110.

The DBR laser element 107 is made up of three regions including a gain region, a phase control region, and a DBR region.

With respect to these three regions, electrodes that are electrically isolated from one another are formed (not illustrated). The DBR laser element 107 is mounted on the silicon substrate 112 in a junction down manner where a surface with the p-n junction faces to the side of the silicon substrate 112, and electrodes corresponding to the gain region, the phase control region, and the DBR region are bonded to the electrodes 101, 102, and 103 (hereinafter called "connection electrodes"), respectively.

Electrodes 104, 105, and 106 are wire-bonding electrodes for carrying out wiring with an external power source so as to electrically drive the gain region, the phase control region, and the DBR region, respectively. Then, these wire-bonding electrodes and the connection electrodes formed corresponding to the respective regions in the DBR laser element 107 are connected with each other by wires 13a, 13b, and 13c, respectively. In this state, by feeding an electrical signal to each of the connection electrodes, an oscillation wavelength of the laser beam emitted from the DBR laser element 107 can be varied. The oscillation wavelength of the laser beam emitted from the DBR laser element 107 is set at 820 nm, and the beam is oscillated in the single longitudinal mode.

The nonlinear optical element 115 is made of $LiNbO_3$, and the optical waveguide 110 having the diffraction grating 111 is formed therein. The nonlinear optical element 115 is fixed onto the silicon substrate 112 at a predetermined position with an adhesive such as a UV curing agent.

The diffraction grating 111 is formed by inverting a polarization of $LiNbO_3$ crystals with the application of an external electric field. The optical waveguide 110 is positioned within 3 $\mu$m of the DBR laser element 107 so as to introduce the laser beam emitted from the DBR laser element 107 securely.

When guiding the laser beam through the optical waveguide 110, an SHG beam with a wavelength of 410 nm generated due to a diffraction by the diffraction grating 111 and the laser beam with an oscillation wavelength of 820 nm are quasi-phase matched. Thereby, an SHG beam having a high output power can be obtained. In addition, by controlling the oscillation wavelength of the laser beam emitted from the DBR laser element 107, a conversion efficiency from the laser beam into the SHG beam can be improved.

In this embodiment, the DBR laser element 107, the optical waveguide 110 of the nonlinear optical element 115, and the electrodes 101 through 106 are arranged on the line 100 on the silicon substrate 112.

Furthermore, the end of the optical waveguide 110 in the nonlinear optical element 115 at the side where the SHG beam is emitted is located at least 5 $\mu$m beyond the edge of the silicon substrate 112. This construction prevents the SHG beam from being reflected from the silicon substrate 112 and scattered, and therefore a favorable image can be obtained in the far field for the SHG beam emitted from the nonlinear optical element 115.

According to this embodiment, since the DBR laser element 107, the optical waveguide 110 of the nonlinear optical element 115, and the electrodes 101 through 106 are arranged on the line 100 on the silicon substrate 112, the width of the wavelength conversion device can be narrowed to 5 mm or less, and therefore a wavelength conversion device having a width approximately the same as the width of the nonlinear optical element 115 can be obtained.

[Embodiment 6]

Figure 6:
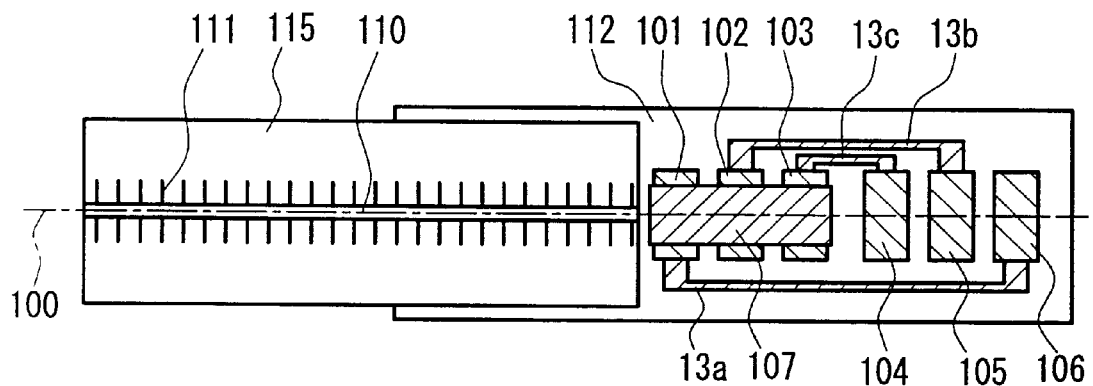
FIG. 6 is a plan view of a wavelength conversion device according to Embodiment 6.

FIG. 6 is a plan view of a wavelength conversion device according to this embodiment. The construction of the wavelength conversion device according to this embodiment is similar to that of the wavelength conversion device according to Embodiment 5, except that the length of the silicon substrate 112 is made 6 mm, which is less than half the length of the silicon substrate 112 in Embodiment 5 (15 mm), and that a length of a region where the DBR laser element 107 is mounted on the silicon substrate 112 is 3 mm along the longitudinal direction of the silicon substrate 112. That is, in this embodiment also, the nonlinear optical element 115 is positioned within 3 $\mu$m of the DBR laser element 107. Therefore, their explanations will be omitted.

According to this embodiment, the same effects as in Embodiment 5 can be obtained. In addition, by reducing the length of the silicon substrate 112, the silicon substrate 112 can be miniaturized, and therefore the wavelength conversion device can be miniaturized and the cost can be reduced. Furthermore, by narrowing the region where the optical element 115 is mounted on the silicon substrate 112, distortion of the optical waveguide 110 generated due to the contact between the nonlinear optical element 115 and the silicon substrate 112 can be reduced, and a conversion efficiency from the laser beam emitted from the DBR laser element 107 into the SHG beam can be improved.

[Embodiment 7]

Figure 7:
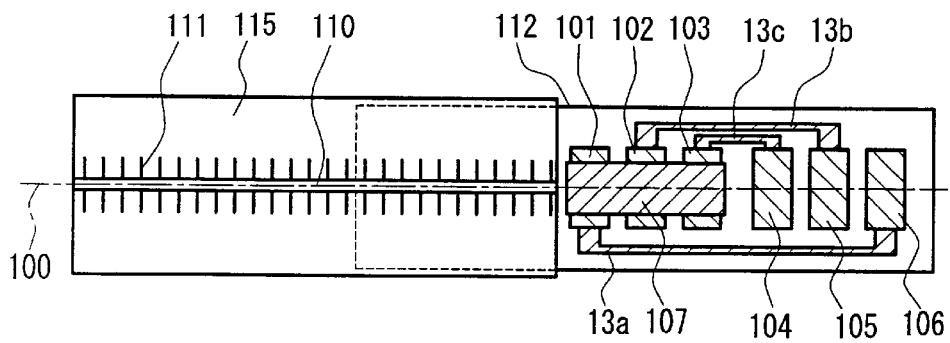
FIG. 7 is a plan view of a wavelength conversion device according to Embodiment 7.

FIG. 7 is a plan view of a wavelength conversion device according to this embodiment. The construction of the wavelength conversion device according to this embodiment is similar to that of the wavelength conversion device according to Embodiment 6, except that the width of the silicon substrate 112 is made to be 2.5 mm, which is narrowed by 0.5 mm versus that in Embodiment 6 (3 mm). That is, in this embodiment also, a length of a region where the DBR laser element 107 is mounted on the silicon substrate 112 is 3 mm along the longitudinal direction of the silicon substrate 112, and the nonlinear optical element 115 is positioned within 3 $\mu$m of the DBR laser element 107. Therefore, their explanations will be omitted.

According to this embodiment, the same effects as in Embodiment 6 can be obtained. In addition, the silicon substrate 112 further can be miniaturized, and therefore the wavelength conversion device can be miniaturized and the cost can be reduced.

[Embodiment 8]

Figure 8:
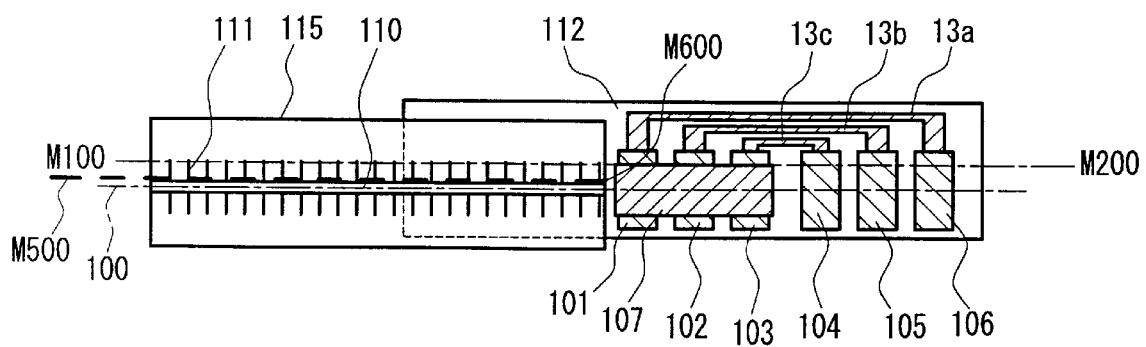
FIG. 8 is a plan view of a wavelength conversion device according to Embodiment 8.

FIG. 8 is a plan view of a wavelength conversion device according to this embodiment. On a silicon substrate 112 (3 mm in width, 15 mm in length), electrodes 101, 102, 103, 104, 105, and 106 are formed by patterning, and a DBR laser element 107 (0.3 mm in width, 1.2 mm in length) and a nonlinear optical element 115 (1.5 mm in width, 10 mm in length) are mounted in an integrated manner. Numeral 110 denotes an optical waveguide, and 111 denotes a diffraction grating formed in the optical waveguide 110. Line 100 is a center line of the optical waveguide 110. Line M100–M200 is a center line of the width direction of the silicon substrate 112 and line M500–M600 is a center line of the width direction of the nonlinear optical element 115.

In this embodiment, the DBR laser element 107, the optical waveguide 110 of the nonlinear optical element 115, and the electrodes 101 through 106 are arranged on the line 100 on the silicon substrate 112, and connection wires 13a, 13b, and 13c are connected to the electrodes 101 through 103 at the same side thereof so as to extend in the longitudinal direction of the silicon substrate 112. Also, the width of the silicon substrate 112 is made to be 2 mm, which is narrowed by 0.5 mm versus that in Embodiment 7 (2.5 mm).

In addition, the nonlinear optical element 115 is mounted on the silicon substrate 112 in such a manner that the center line 100 of its optical waveguide 110 is 0.5 mm away from the center line M100–M200 of the silicon substrate 112 and 0.3 mm away from the center line M500–M600 of the nonlinear optical element 115. Thereby, the width of the nonlinear optical element 115 is narrowed further to 1.5 mm from 2.0 mm.

In the same manner as in Embodiment 7, a length of a region where the DBR laser element 107 is mounted on the silicon substrate 112 is 3 mm along the longitudinal direction of the silicon substrate 112, and the nonlinear optical element 115 is positioned within 3 $\mu$m of the DBR laser element 107.

According to this embodiment, the same effects as in Embodiment 7 can be obtained. In addition, with the construction where the connection wires 13a, 13b, and 13c are connected to the electrodes 101 through 103 at the same side thereof on the silicon substrate 112, and the nonlinear optical element 115 is mounted on the silicon substrate 112 in such a manner that the optical waveguide 110 is away from the center line M100–M200 of the silicon substrate 112 and away from the center line of the nonlinear optical element 115, regions where any components and wires are not formed on the silicon substrate 112 can be reduced, and the width of the silicon substrate 112 can be narrowed, and therefore a wavelength conversion device using the same can be miniaturized.

[Embodiment 9]

Figure 9:
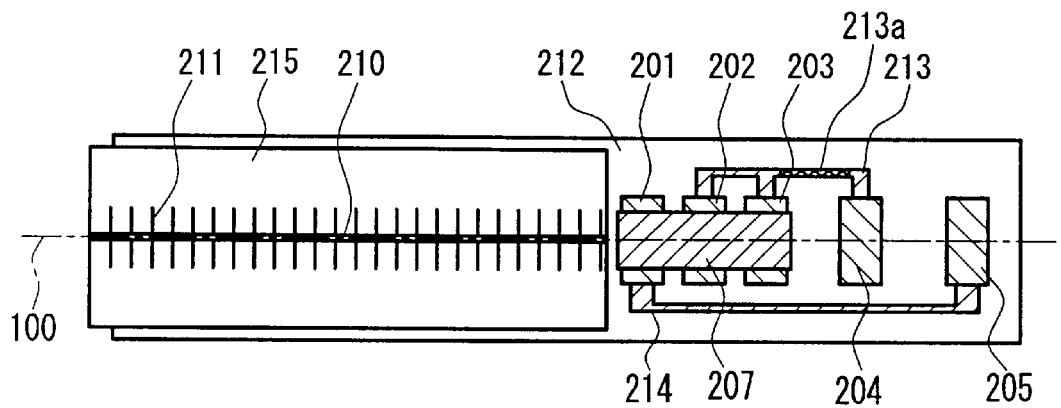
FIG. 9 is a plan view of a wavelength conversion device according to Embodiment 9.

FIG. 9 is a plan view of a wavelength conversion device according to this embodiment. On a silicon substrate 212 (3 mm in width, 15 mm in length), electrodes 201, 202, 203, 204, and 205 are formed by patterning, and a DBR laser element 207 (0.3 mm in width, 1.2 mm in length) and a nonlinear optical element 215 (2.8 mm in width, 10 mm in length) are mounted in an integrated manner. Numeral 210 denotes an optical waveguide, and 211 denotes a diffraction grating formed in the optical waveguide 210. Line 100 is a center line of the optical waveguide 210.

The DBR laser element 207 is made up of three regions including a gain region, a phase control region, and a DBR region.

With respect to these three regions of the DBR laser element 207, electrodes that are electrically isolated from one another are formed (not illustrated). The DBR laser element 207 is mounted on the silicon substrate 212 in a junction down manner where a surface with the p-n junction faces to the side of the silicon substrate 212, and electrodes corresponding to the gain region, the phase control region, and the DBR region are bonded to the electrodes 201, 202, and 203 (connection electrodes), respectively.

Electrodes 204 and 205 are wire-bonding electrodes for carrying out wiring with an external power source so as to electrically drive the gain region, the phase control region, and the DBR region, respectively. Then, these wire-bonding electrodes and the connection electrodes formed corresponding to the respective regions in the DBR laser element 207 are connected with each other by wires 214 and 213. Here, the wire 214 is connected to the gain region, and the wire 213 is connected to the phase control region and the DBR region. The wire 214 is made of metal, and the wire 213 is made of p-type polysilicon with a resistor 213a formed at a portion thereof.

In this state, by feeding an electrical signal to each of the connection electrodes, an oscillation wavelength of the laser beam emitted from the DBR laser element 207 can be varied. By varying a voltage applied across the electrode 205, a current fed into the gain region in the DBR laser element 207 can be controlled, and thus an output power of the laser beam can be controlled. The oscillation wavelength of the laser beam emitted from the DBR laser element 207 is set at 820 nm, and the beam is oscillated in the single longitudinal mode.

The nonlinear optical element 215 is made of $LiNbO_3$, and the optical waveguide 210 having the diffraction grating 211 is formed therein. The nonlinear optical element 215 is fixed onto the silicon substrate 212 at a predetermined position with an adhesive such as a UV curing agent.

The diffraction grating 211 is formed by inverting a polarization of $LiNbO_3$ crystals with the application of an external electric field. The optical waveguide 210 is positioned within 3 μm of the DBR laser element 207 so as to introduce the laser beam emitted from the DBR laser element 207 securely.

When guiding the laser beam through the optical waveguide 210, an SHG beam with a wavelength of 410 nm generated due to a diffraction by the diffraction grating 211 and the laser beam with an oscillation wavelength of 820 nm are quasi-phase matched. Thereby, an SHG beam having a high output power can be obtained. In addition, by controlling the oscillation wavelength of the laser beam emitted from the DBR laser element 207, a conversion efficiency from the laser beam into the SHG beam can be improved.

In this embodiment, the DBR laser element 207, the optical waveguide 210 of the nonlinear optical element 215, and the electrodes 201 through 205 are arranged on the line 100 on the silicon substrate 212. With this construction, the width of the wavelength conversion device can be narrowed to 5 mm or less, and a small wavelength conversion device having approximately the same width as the nonlinear optical element 215 can be realized.

By providing the DBR laser element 207 with the phase control region, in addition to the gain region and the DBR region, so-called mode hopping can be prevented, and thus the oscillation wavelength can be controlled continuously. Unlike the gain region, the phase control region is a region from which gain is not obtained by the passage of electric current. In addition, the phase control region does not have a wavelength selectivity, because it is not provided with a diffraction grating as in the DBR region. When passing electric current through the phase control region, an effective refractive index in the optical waveguide within the region varies, and therefore a phase of the laser beam at a resonant state can be changed.

Figure 13:
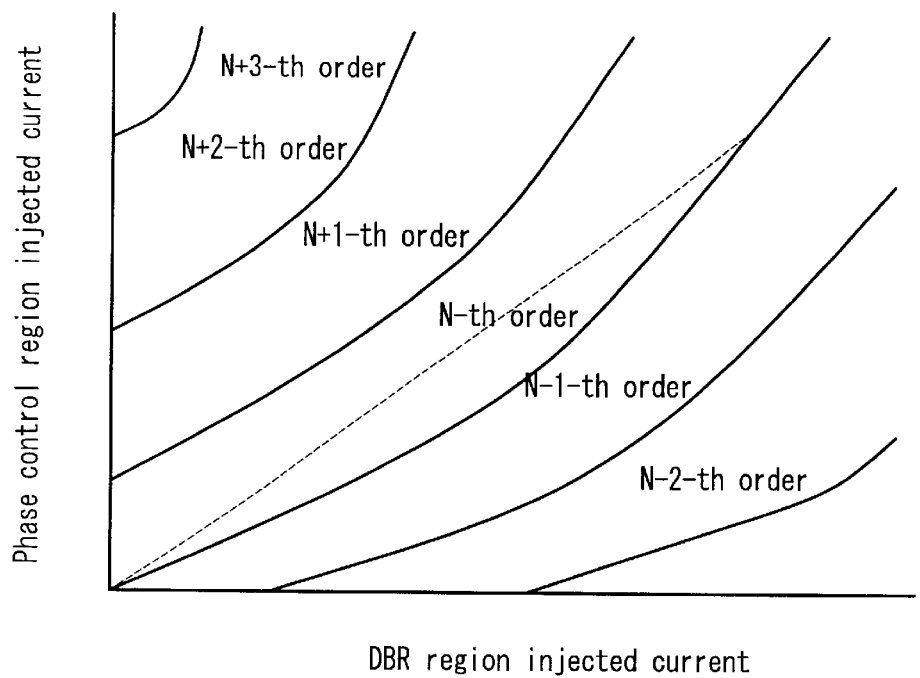
FIG. 13 is a graph showing the relationship among oscillation longitudinal mode orders, and amount of current fed into a phase control region and a DBR region.

FIG. 13 is a graph showing a relationship among oscillation longitudinal mode orders, amount of current fed into the phase control region and the DBR region in an AlGaAs class laser element. When injecting an electric current into the DBR region, the effective refractive index is increased, and the Bragg wavelength is shifted to the long wavelength side. Therefore, the oscillation longitudinal mode order mode-hops from the N-th to N−1-th, i.e., to the lower order. Meanwhile, when injecting an electric current into the phase control region, the effective refractive index is increased, and the effective cavity length is increased. Therefore, the oscillation longitudinal mode order mode-hops from the N-th to N+1-th, i.e., to the higher order.

Consequently, as shown by the broken line in FIG. 13 where a ratio of the current injected into the DBR region to that into the phase control region is kept constant, when injecting an electrical current into the DBR region, the Bragg wavelength is shifted to the long wavelength side, and the oscillation wavelength whose mode gain is the highest is shifted to the long wavelength side. When injecting an electric current into the phase control region, the effective refractive index in this region is increased, and the effective resonator length is increased. Therefore, even when the oscillation wavelength shifts to the longer wavelength side, the oscillation at the same N-th longitudinal mode can be kept in the same phase state, and thus mode hopping can be prevented.

Figure 14:
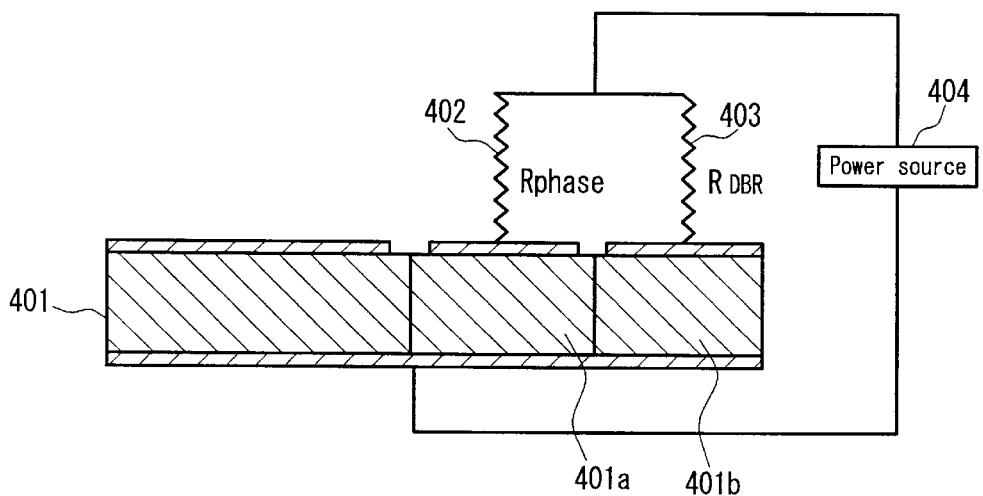
FIG. 14 is a circuit diagram showing a state where the phase control region and the DBR region of the semiconductor laser device are driven at the same voltage.
Figure 15:
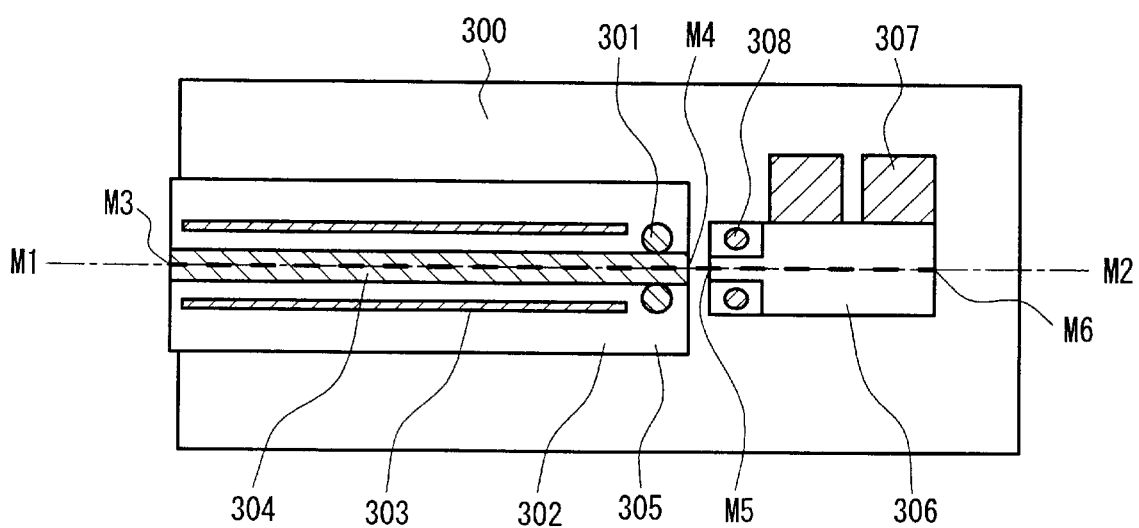
FIG. 15 is a plan view of a wavelength conversion device according to the prior art.

FIG. 14 is a circuit diagram showing a state where resistors are connected in series to each of the phase control region 401a and the DBR region 401b in the semiconductor laser device 401 and the respective regions are driven with the same bias voltage applied by the power source 404. In such a state, current injected into the phase control region and the DBR region has the relationship as represented by the following formula (1).

$$I_{DBR}=(R_2+R_{DBR})/(R_1+R_{PHASE})\times I_{PHASE} \quad (1)$$

Here, $I_{PHASE}$ and $I_{DBR}$ are currents injected into the phase control region and the DBR region, respectively. $R_1$ and $R_{PHASE}$ are a value of differential resistance of the phase control region (constant value) and a value of resistance of the resistor 402 connected to the phase control region, respectively, while $R_2$ and $R_{DBR}$ are a value of differential resistance of the DBR region (constant value) and a value of resistance of the resistor 403 connected to the DBR region, respectively.

Therefore, as shown by Formula (1), by varying the values of $R_{PHASE}$ and $R_{DBR}$ connected to the phase control region and the DBR region, a ratio between the current $I_{DBR}$ and $I_{PHASE}$ (i.e., $(R_2+R_{DBR})/(R_1+R_{PHASE})$, hereinafter, referred to as a ratio between currents) can be controlled.

In this embodiment, as shown in FIG. 9, the resistor 213a is formed at a portion of the wire connected between the phase control region and the DBR region in the semiconductor laser device. Assuming that the resistor 213a has a value of resistance represented by R, the ratio between currents becomes $I_{DBR}/I_{PHASE}=(R_2+R)/(R_1+R)$. Therefore, by adjusting the value R of the resistor 213a so that the oscillation longitudinal mode orders does not generate mode-hopping, the oscillation wavelength of the laser beam emitted from the semiconductor laser device can be varied continuously. Note here that the value of R preferably is set within a range between $10^{-3}$ Ω·cm and $10^6$ Ω·cm.

According to this embodiment, by providing a portion of the wire connected between the phase control region and the DBR region with a function as a resistor and adjusting the value of the resistor, the oscillation wavelength of the laser beam emitted from the semiconductor laser device can be controlled with stability.

[Embodiment 10]

Figure 10:
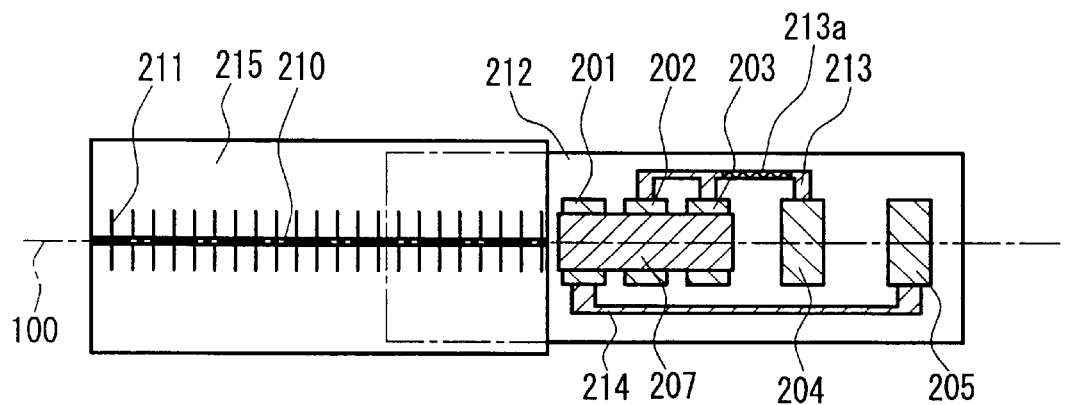
FIG. 10 is a plan view of a wavelength conversion device according to Embodiment 10.

FIG. 10 is a plan view of a wavelength conversion device according to this embodiment. The construction of the wavelength conversion device is similar to that of the wavelength conversion device according to Embodiment 9, except that the length of the silicon substrate 212 in the longitudinal direction is made to be 6 mm, which is a half or less of the length in Embodiment 9 (15 mm), the length of a region where the DBR laser element 207 is mounted on the silicon substrate 212 in the longitudinal direction of the silicon substrate 212 is 3 mm, and the width of the silicon substrate 212 is made to be 2 mm, which is narrowed by 1 mm from the width of the silicon substrate 212 in Embodiment 9 (3 mm). That is, in this embodiment also, the nonlinear optical element 215 is positioned within 3 μm of the DBR laser element 207. Therefore, their explanations will be omitted.

According to this embodiment, the same effects as in Embodiment 9 can be obtained. In addition, by reducing the length of the silicon substrate 212, the silicon substrate 212 can be miniaturized, and therefore the wavelength conversion device can be miniaturized and the cost can be reduced. Furthermore, by narrowing the region where the optical element 215 is mounted on the silicon substrate 212, distortion of the optical waveguide 210 generated due to the contact between the nonlinear optical element 215 and the silicon substrate 212 can be reduced, and a conversion efficiency from the laser beam emitted from the DBR laser element 207 into the SHG beam can be improved.

[Embodiment 11]

Figure 11:
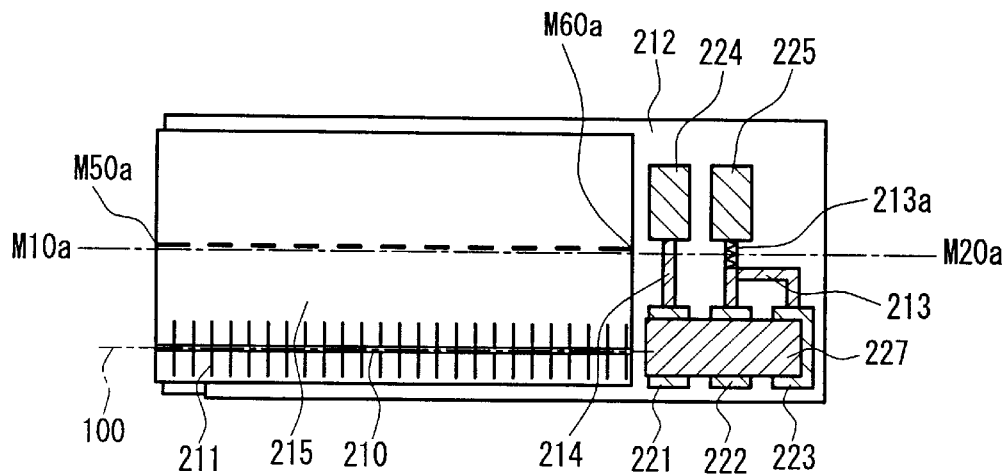
FIG. 11 is a plan view of a wavelength conversion device according to Embodiment 11.

FIG. 11 is a plan view of a wavelength conversion device according to this embodiment. On a silicon substrate 212 (3.2 mm in width, 11.5 mm in length), electrodes 221, 222, 223, 224, and 225 are formed by patterning, and a DBR laser element 227 (0.3 mm in width, 1.2 mm in length) and a nonlinear optical element 215 (3 mm in width, 10 mm in length) are mounted in an integrated manner. Numeral 210 denotes an optical waveguide, and 211 denotes a diffraction grating formed in the optical waveguide 210. Line 100 is a center line of the optical waveguide 210. Line M10a–M20a is a center line of the width direction of the silicon substrate 212 and line M50a–M60a is a center line of the width direction of the nonlinear optical element 215.

The DBR laser element 227 is made up of three regions including a gain region, a phase control region, and a DBR region.

With respect to these three regions, electrodes that are electrically isolated from one another are formed (not illustrated). The DBR laser element 227 is mounted on the silicon substrate 212 in a junction down manner where a surface with the p-n junction faces to the side of the silicon substrate 212, and electrodes corresponding to the gain region, the phase control region, and the DBR region are bonded to the electrodes 221, 222, and 223 (connection electrodes), respectively.

Electrodes 224 and 225 are wire-bonding electrodes for carrying out wiring with an external power source so as to electrically drive the gain region, the phase control region, and the DBR region, respectively. Then, a wire 214 is connected between the electrodes 221 and 224, and a wire 213 is connected among the electrodes 222 and 223, and 225. The wire 214 is made of metal, and the wire 213 is made of p-type polysilicon with a resistor 213a formed at a portion thereof.

In this state, by feeding an electrical signal to each of the connection electrodes, an oscillation wavelength of the laser beam emitted from the DBR laser element 227 can be varied. By varying a voltage applied across the electrode 224, a current fed into the gain region in the DBR laser element 227 can be controlled, and thus an output power of the laser beam can be controlled. The oscillation wavelength of the laser beam emitted from the DBR laser element 227 is set at 820 nm, and the light is oscillated in the single longitudinal mode.

The nonlinear optical element 215 is made of $LiNbO_3$, and the optical waveguide 210 having the diffraction grating 211 is formed therein. The nonlinear optical element 215 is fixed onto the silicon substrate 212 at a predetermined position with an adhesive such as a UV curing agent.

The diffraction grating 211 is formed by inverting a polarization of $LiNbO_3$ crystals with the application of an external electric field. The optical waveguide 210 is positioned within 3 μm of the DBR laser element 227 so as to introduce the laser beam emitted from the DBR laser element 227 securely.

When guiding the laser beam through the optical waveguide 210, an SHG beam with a wavelength of 410 nm generated due to a diffraction by the diffraction grating 211 and the laser beam with an oscillation wavelength of 820 nm are quasi-phase matched. Thereby, an SHG beam having a high output power can be obtained. In addition, by controlling the oscillation wavelength of the laser beam emitted from the DBR laser element 227, a conversion efficiency from the laser beam into the SHG beam can be improved.

In this embodiment, as shown in FIG. 11, the nonlinear optical element 215 is mounted on the substrate in such a manner that the center line 100 of its optical waveguide 210 is located 1.0 mm away from the center line M10a–M20a of the silicon substrate 212. In this way, the optical waveguide 210 does not necessarily need to be formed on the center line M50a–M60a of the nonlinear optical element 215.

In addition, although the nonlinear optical element is mounted on the substrate in such a manner that the center line M10a–M20a of the silicon substrate 212 coincides with the center line M50a–M60a of the nonlinear optical element 215, these center lines do not necessarily need to be aligned.

Furthermore, the end of the optical waveguide 210 at the side of the optical waveguide 210 where the SHG beam is emitted is located at least 5 μm beyond the edge of the silicon substrate 212. This construction prevents the SHG beam from being reflected from the silicon substrate 212 and scattered, and therefore a favorable image can be obtained in the far field for the SHG beam emitted from the nonlinear optical element 215.

In this embodiment, a resistor 213a is formed at a portion of the wire connected between the phase control region and the DBR region of the semiconductor laser device. Due to the same principle as in Embodiment 9, by controlling the value R of the resistor 213a so that the oscillation longitudinal mode orders do not generate mode-hopping, the oscillation wavelength of the laser beam emitted from the semiconductor laser device can be varied continuously. Note here that the value of R preferably is set within a range between $10^{-3}$ Ω·cm and $10^6$ Ω·cm.

According to this embodiment, by providing a portion of the wire connected between the phase control region and the DBR region with a function as a resistor and controlling the value of the resistor, the oscillation wavelength of the laser beam emitted from the semiconductor laser device can be controlled with stability.

In addition, since the nonlinear optical element 215 is mounted on the substrate in such a manner that its optical waveguide 210 is located away from the center line M10a–M20a of the silicon substrate 212, the width of the wavelength conversion device can be narrowed to 5 mm or less, and therefore a small wavelength conversion device having approximately the same size as the nonlinear optical element 215 can be realized. As a result, the silicon substrate 212 further can be miniaturized, and therefore the wavelength conversion device can be miniaturized and the cost can be reduced.

[Embodiment 12]

Figure 12:
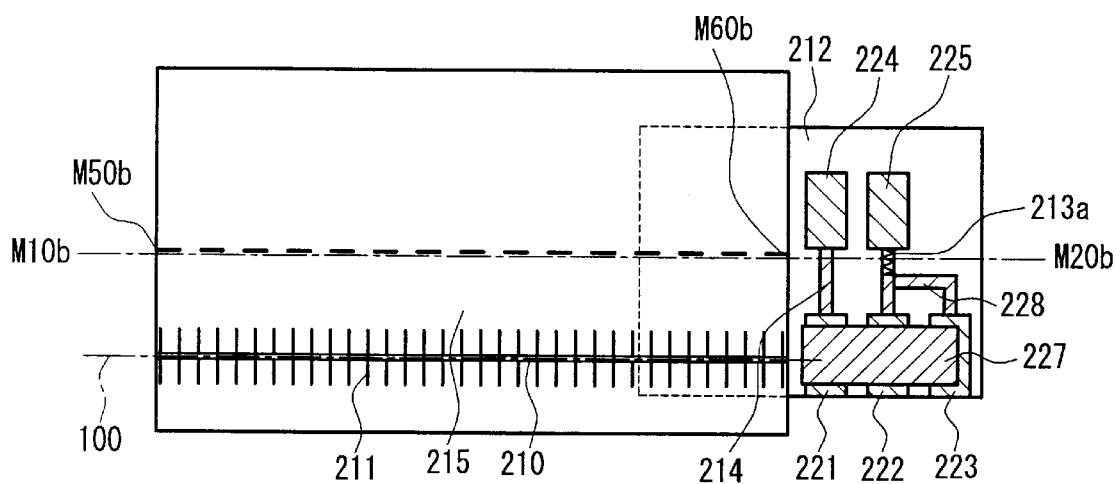
FIG. 12 is a plan view of a wavelength conversion device according to Embodiment 12.

FIG. 12 is a plan view of a wavelength conversion device according to this embodiment. On a silicon substrate 212 (2.0 mm in width, 6 mm in length), electrodes 221, 222, 223, 224, and 225 are formed by patterning, and a DBR laser element 227 (0.3 mm in width, 1.2 mm in length) and a nonlinear optical element 215 (2.8 mm in width, 10 mm in length) are mounted in an integrated manner. Numeral 210 denotes an optical waveguide, and 211 denotes a diffraction grating formed in the optical waveguide 210. Line 100 is a center line of the optical waveguide 210. Line M10b–M20b is a center line of the width direction of the silicon substrate 212 and line M50b–M60b is a center line of the width direction of the nonlinear optical element 215. In this way, the construction of the wavelength conversion device in this embodiment is similar to that of the wavelength conversion device according to Embodiment 11, except that the silicon substrate 212 is miniaturized so that a length of a region where the DBR laser element 227 is mounted on the silicon substrate 212 is 3 mm along the longitudinal direction of the silicon substrate 212, and the nonlinear optical element 215 is mounted on the substrate so that the center line 100 of its optical wavelength 210 is 0.7 mm away from the center line of the silicon substrate 212. That is, in this embodiment also, the nonlinear optical element 215 is arranged within 3 μm from the DBR laser element 227 so as to securely introduce the laser beam emitted from the DBR laser element 227. Therefore, their explanations will be omitted.

According to this embodiment, the same effects as in Embodiment 11 can be obtained. In addition, by reducing the length of the silicon substrate 212, the region where the nonlinear optical element is mounted on the silicon substrate 212 is narrowed. Therefore, distortion generated due to the contact between the nonlinear optical element 215 and the silicon substrate 212 can be reduced, and a conversion efficiency from the laser beam emitted from the DBR laser element 227 into the SHG beam can be improved.

In the above-stated embodiments, the substrate is made of silicon. However, instead of silicon, materials such as SiC or AlN may be used. With these materials, thermal dissipation of the device can be improved, the operational current of the semiconductor laser device can be decreased, and the operational temperature range of the semiconductor laser device can be broadened. Alternatively, resin such as plastic may be used. If using a resin substrate, an electrical wiring pattern can be integrated on the substrate. As a result, a more light-weight, miniaturized, and low-cost wavelength conversion device can be obtained.

In the above-stated embodiments, the nonlinear optical elements are made of $LiNbO_3$. Instead, materials such as $LiTaO_3$, $KTiOPO_4$, and $KNbO_3$ may be used.

In the above-stated embodiments, DBR laser elements are used as the semiconductor laser device. Instead, multielectrode driven type laser elements such as a multielectrode semiconductor laser device capable of a Fabry-Perot mode oscillation, a multielectrode Distributed Feedback (abbreviated as "DFB") type laser element, a multielectrode bistable semiconductor laser element, and a pulse laser may be used. With these elements, the time dependency of the output power of the SHG beam can be lessened. Alternatively, instead of the DBR laser element, laser elements whose wavelength can be controlled may be used.

In the above-stated embodiments, the semiconductor laser devices have three regions. However, insofar as the oscillation wavelength of the laser beam emitted therefrom can be controlled adequately, semiconductor laser devices having two regions or four or more regions may be used.

If optical components such as a lens, birefringence material, prism, mirror, and an optical modulator may be integrated as the integrated components, in addition to the semiconductor laser device and the nonlinear optical element, a small wavelength conversion device can be obtained.

Furthermore, the wires connecting components may be integrated on the silicon substrate directly. In the case of the substrate made of silicon, instead of metal, polycrystal silicon, p-type silicon, and n-type silicon can be used as a material of the wire.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A wavelength conversion device that converts a wavelength by second harmonic-wave generation and generates a laser beam, comprising:
   a substrate having a plurality of electrodes;
   a semiconductor laser device mounted on the substrate and electrically connected to the plurality of electrodes; and
   a nonlinear optical element having an optical waveguide for guiding a laser beam emitted from the semiconductor laser device and for converting a wavelength of the laser beam,
   wherein the nonlinear optical element is mounted on the substrate in such a manner that the optical waveguide in the nonlinear optical element is located away from the a center line of the substrate, and
   the plurality of the electrodes are arranged to extend from at least the center line of the substrate to at least a center line of the optical waveguide.

2. The wavelength conversion device according to claim 1, wherein a distance between the optical waveguide and the center line of the substrate is within a range between 0.3 mm and 1 mm.

3. The wavelength conversion device according to claim 1, wherein the plurality of electrodes are formed on the substrate so as to be asymmetrical with respect to the center line of the substrate.

4. The wavelength conversion device according to claim 1, wherein each of the plurality of electrodes on the substrate includes a first region for carrying out an electrical connection with the semiconductor laser device and a second region for carrying out an electrical connection with an external power source,
   wherein a width of a portion formed between the first region and the second region of the electrode is narrower than widths of the first region and second region.

5. The wavelength conversion device according to claim 1, wherein the semiconductor laser device is a DBR semiconductor laser device.

6. The wavelength conversion device according to claim 5, wherein the DBR semiconductor laser device is made up of three regions including a gain region, a phase control region, and a wavelength control region.

7. The wavelength conversion device according to claim 1, wherein the optical waveguide in the nonlinear optical element has a diffraction grating.

8. The wavelength conversion device according to claim 1, wherein the substrate is made of any one of silicon, SiC, AlN, and resin.

9. The wavelength conversion device according to claim 1, wherein a width of the substrate is narrower than a width of the nonlinear optical element.

10. The wavelength conversion device according to claim 1, wherein one end of the optical waveguide in the nonlinear optical element is located beyond an edge of the substrate.

11. The wavelength conversion device according to claim 1, wherein at least one of the plurality of electrodes is divided into a plurality of regions.

12. A wavelength conversion device that converts a wavelength by second harmonic-wave generation and generates a laser beam, comprising;

a substrate having a plurality of electrodes;

a semiconductor laser device electrically connected to the plurality of electrodes; and a nonlinear optical element having an optical waveguide for guiding a laser beam emitted from the semiconductor laser device and for converting a wavelength of the laser beam, wherein the semiconductor laser device, the optical waveguide of the nonlinear optical element, and the plurality of electrodes are on approximately one line on the substrate, and the semiconductor laser device is arranged between the plurality of electrodes and the nonlinear optical element.

13. The wavelength conversion device according to claim 12, wherein a width of the nonlinear optical element is within a range between 1.5 mm and 3 mm.

14. The wavelength conversion device according to claim 12, wherein the semiconductor laser device is a DBR semiconductor laser device.

15. The wavelength conversion device according to claim 14, wherein the DBR semiconductor laser device is made up of three regions including a gain region, a phase control region, and a wavelength control region.

16. The wavelength conversion device according to claim 12, wherein the optical waveguide in the nonlinear optical element has a diffraction grating.

17. The wavelength conversion device according to claim 12, wherein the substrate is made of any one of silicon, SiC, AlN, and resin.

18. The wavelength conversion device according to claim 12, wherein a width of the substrate is narrower than a width of the nonlinear optical element.

19. The wavelength conversion device according to claim 12, wherein one end of the optical waveguide in the nonlinear optical element is located beyond an edge of the substrate.

20. The wavelength conversion device according to claim 12, wherein the nonlinear optical element is mounted on the substrate in such a manner that the optical waveguide in the nonlinear optical element is located away from the center line of the substrate.

21. The wavelength conversion device according to claim 12, wherein at least one of the plurality of electrodes is divided into a plurality of regions.

22. A wavelength conversion device that converts a wavelength by second harmonic-wave generation and generates a laser beam comprising;

a substrate having a plurality of electrodes;

a semiconductor laser device mounted on the substrate and including three regions of a gain region, a phase control region, and a wavelength control region; and a nonlinear optical element mounted on the substrate and for converting a wavelength of a laser beam emitted from the semiconductor laser device, wherein the plurality of electrodes include a first electrode group formed corresponding to the three regions and a second electrode group for carrying out wire-bonding with an external power source, the three regions of the semiconductor laser device are connected electrically to respective electrodes in the first electrode group, and the first electrode group further is connected to respective electrodes in the second electrode group via wires, and a wire among the wires, which is connected between the phase control region and the wavelength control region of the semiconductor laser device, has a portion functioning as a resistor for controlling a phase and a wavelength of the laser beam emitted from the semiconductor laser device by Joule heat.

23. The wavelength conversion device according to claim 22, wherein the semiconductor laser device, an optical waveguide of the nonlinear optical element, and the plurality of electrodes are on approximately one line on the substrate.

24. The wavelength conversion device according to claim 22, wherein a value of resistance at the portion functioning as the resistor is within a range between $10^{-3}$ $\Omega \cdot$cm and $10^6$ $\Omega \cdot$cm.

25. The wavelength conversion device according to claim 22, wherein the portion functioning as the resistor is shared among the wires connected to the phase control region and the wavelength control region.

26. The wavelength conversion device according to claim 22, wherein the semiconductor laser device is a DBR semiconductor laser device.

27. The wavelength conversion device according to claim 22, wherein the optical waveguide in the nonlinear optical element has a diffraction grating.

28. The wavelength conversion device according to claim 22, wherein the nonlinear optical element is mounted on the substrate in such a manner that the optical waveguide in the nonlinear optical element is located away from the center line of the substrate.

29. The wavelength conversion device according to claim 22, wherein the substrate is made of any one of silicon, SiC, AlN, and resin.

30. The wavelength conversion device according to claim 22, wherein a width of the substrate is narrower than a width of the nonlinear optical element.

31. The wavelength conversion device according to claim 22, wherein one end of the optical waveguide in the nonlinear optical element is located outside from an edge of the substrate.

32. The wavelength conversion device according to claim 22, wherein the functioning as the resistor is made of p-type polysilicon.

* * * * *